US008890704B2

(12) United States Patent
Barrieau et al.

(10) Patent No.: US 8,890,704 B2
(45) Date of Patent: Nov. 18, 2014

(54) METHOD AND APPARATUS FOR MONITORING TRANSIENT ELECTRICAL STRIKES

(75) Inventors: Mark P. Barrieau, Baldwinville, MA (US); Daniel Cianfrocco, Worcester, MA (US)

(73) Assignee: Tyco Fire & Security GmbH, Neuhausen am Rheinfall (CH)

( * ) Notice: Subject to any disclaimer, the term of this patent is extended or adjusted under 35 U.S.C. 154(b) by 125 days.

(21) Appl. No.: 13/540,690

(22) Filed: Jul. 3, 2012

(65) Prior Publication Data

US 2014/0009297 A1     Jan. 9, 2014

(51) Int. Cl.
*G08B 21/00* (2006.01)
*G01W 1/16* (2006.01)
*G01R 29/08* (2006.01)

(52) U.S. Cl.
CPC ............. *G01W 1/16* (2013.01); *G01R 29/0842* (2013.01)
USPC .......... 340/653; 340/539.28; 340/601; 702/4; 324/72; 73/170.24

(58) Field of Classification Search
CPC . G01W 1/16; G01R 29/0842; F03D 11/0033; G08B 21/08
USPC .................... 340/539.11, 539.28, 601; 702/4; 324/72; 73/170.24
See application file for complete search history.

(56) References Cited

U.S. PATENT DOCUMENTS

| | | | | |
|---|---|---|---|---|
| 4,706,016 A | * | 11/1987 | Schweitzer, Jr. | 324/102 |
| 5,168,212 A | * | 12/1992 | Byerley et al. | 324/72 |
| 5,448,161 A | * | 9/1995 | Byerley et al. | 324/72 |
| 7,327,271 B2 | * | 2/2008 | Greenstein et al. | 340/601 |
| 8,010,289 B1 | * | 8/2011 | Ryan et al. | 702/4 |

\* cited by examiner

*Primary Examiner* — John A Tweel, Jr.
(74) *Attorney, Agent, or Firm* — Kacvinsky Daisak Bluni PLLC

(57) ABSTRACT

A transient electrical energy strike detector is disclosed. The detector may be integral with the circuitry of a fire alarm panel of a fire alarm system and may identify and record transient electrical energy strikes sustained by the electrical protection circuitry of the system. Particularly, voltage fluctuations in the fire alarm panel circuitry that are outside of a predefined operating voltage range may be identified by the pulse detector as representing transient electrical energy strikes. The pulse detector may increment a counter upon the occurrence of each identified transient energy strike, and may maintain a comprehensive record of such strikes in a memory unit, including a magnitude, duration, time, and date of each strike.

19 Claims, 3 Drawing Sheets

METHOD AND APPARATUS FOR MONITORING TRANSIENT ELECTRICAL STRIKES

FIELD OF THE DISCLOSURE

The disclosure relates generally to electrical protection systems, and more particularly to an apparatus and method for monitoring electrical circuitry for the occurrence of transient electrical energy strikes.

BACKGROUND OF THE DISCLOSURE

Fire alarm systems typically include one or more centralized fire alarm panels for controlling and/or receiving information from sensors and notification devices distributed throughout a structure. Such fire alarm panels, sensors, and notification devices are typically connected to one another by conductive field wiring that can extend many hundreds, or even thousands, of feet. Due to its length, the field wiring is susceptible to transient electrical energy that may be generated by sources such as nearby lightning strikes and electrical motor startups. Such transient energy strikes can damage or disable a fire alarm system, causing premature failure and rendering the system incapable of detecting and/or providing notification of hazardous conditions. Fire alarm systems are therefore required to pass certain tests to demonstrate that electrical protection circuitry within such systems can resist various levels of transient energy. For example, Underwriters Laboratories (UL) 864, which sets forth accepted standards for control units and accessories for fire alarm systems, prescribes a test wherein fire alarm system circuitry is exposed to a plurality of electrical energy pulses across a range of voltages. These energy pulses place stress on the protection circuitry within a fire alarm system and thereby identify deficiencies in such circuitry.

While stress tests such as the one described above are generally effective for evaluating the performance of fire alarm system protection circuitry at the particular time such a test is performed, there have heretofore been no means for continuously monitoring fire alarm systems for the occurrence of actual transient energy events. Knowledge of the number and severity of such events could be useful for determining whether an alarm system or its components should be preemptively repaired or replaced (i.e., prior to impending failure), or for determining the cause of an alarm system's failure after such failure has already occurred. For example, if an alarm system fails prior to the expiration of its expected useful life, a customer may assume that the premature failure resulted from deficiencies in the quality of the protection circuitry in the system, when the failure was in-fact caused by an inordinate number of transient energy strikes to the system.

SUMMARY

In view of the forgoing, a system and method are disclosed for continuously monitoring fire alarm system circuitry for the occurrence of transient electrical energy strikes.

In accordance with the present disclosure, there is provided a transient electrical energy strike detector (hereinafter referred to as the "pulse detector"). The pulse detector may be integral with the circuitry of a fire alarm panel of a fire alarm system and may identify and record transient electrical energy strikes sustained by the electrical protection circuitry of the system. Particularly, voltage fluctuations in the fire alarm panel circuitry that are outside of a predefined operating voltage range may be identified by the pulse detector as representing transient electrical energy strikes. The pulse detector may increment a counter upon the occurrence of each identified transient energy strike, and may maintain a comprehensive record of such strikes, including a magnitude, duration, time, and date of each strike.

An embodiment of the device disclosed herein can thus include a pulse detector for monitoring transient electrical energy strikes sustained by a circuit, wherein the pulse detector includes a processor operatively connected to the circuit. The processor may be configured to increment a counter upon identifying the occurrence of a transient electrical energy strike to the circuit. The pulse detector may further include a memory operatively connected to the processor, wherein the memory is configured to store data generated by the processor, including a magnitude, duration, time, and date of each transient energy strike that is detected.

A method disclosed herein for monitoring transient electrical energy strikes sustained by a circuit can thus include monitoring a voltage in the circuit and identifying voltage fluctuations in the circuit that represent transient electrical energy strikes sustained by the circuit. The method may further include incrementing a counter each time a transient strike is detected.

BRIEF DESCRIPTION OF THE DRAWINGS

By way of example, a specific embodiment of the disclosed device will now be described, with reference to the accompanying drawings, in which.

DETAILED DESCRIPTION

Figure 1:
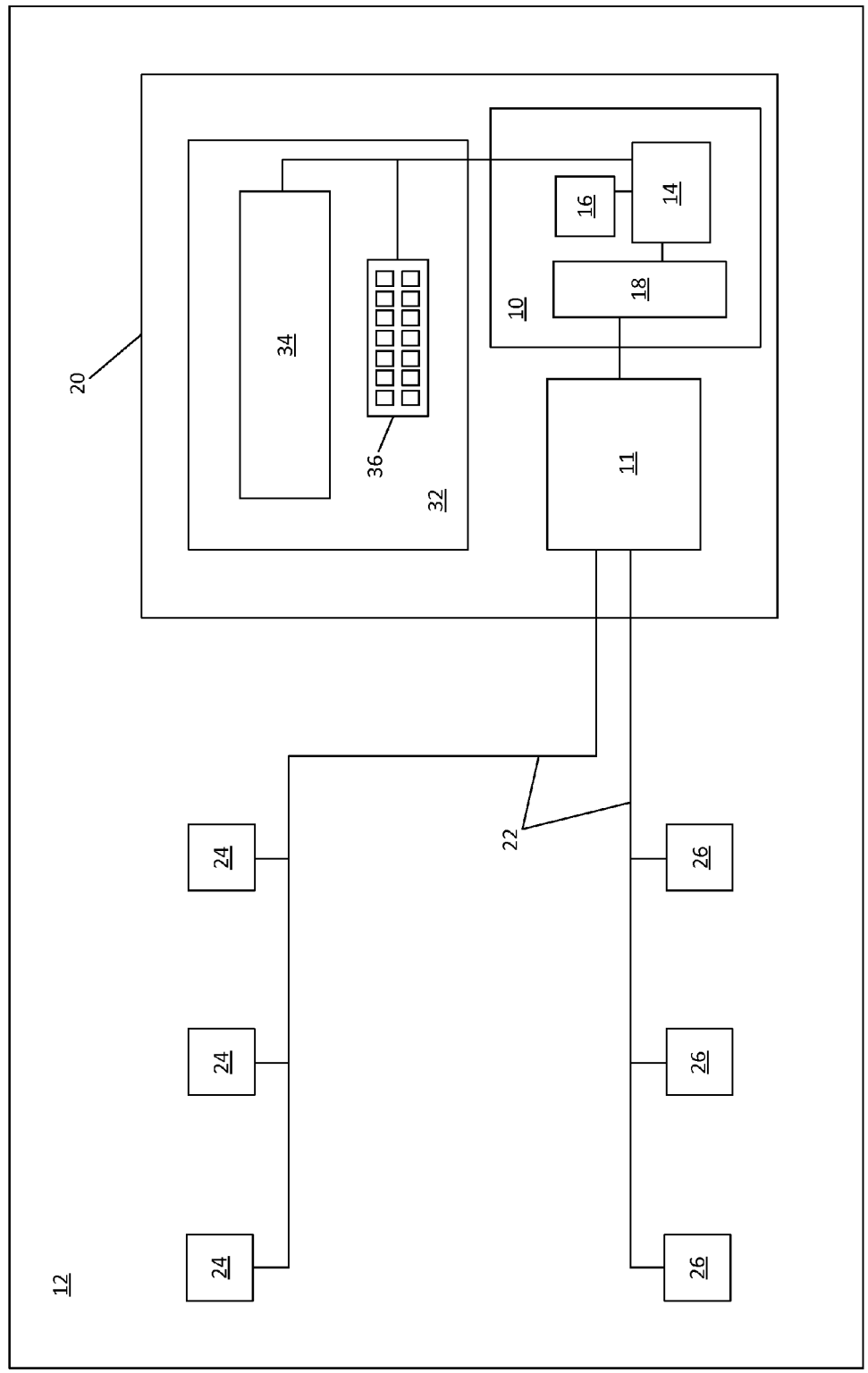
FIG. 1 is a schematic diagram illustrating an embodiment of a transient electrical strike detector in accordance with the present disclosure.

Referring to FIG. 1, a pulse detector 10 in accordance with the present disclosure is shown. The pulse detector 10 is provided for monitoring the electrical protection circuitry 11 of a fire alarm system 12 for occurrences of transient electrical energy strikes and maintaining a record of such strikes as further described below.

The pulse detector 10 may include a processor 14, such as, for example, an application specific integrated circuit (ASIC), field-programmable gate array (FPGA), digital signal processor (DSP), microcontroller unit (MCU), or other computing device capable of receiving electrical signal input from the fire alarm panel circuitry 11 and executing software instructions as further described below. The pulse detector 10 may further include a memory unit 16 for storing data generated by the processor 14. Still further, the pulse detector 10 may include conditioning circuitry 18 for conditioning electrical signal input from the fire alarm panel circuitry 11 before the input is passed on to the processor 14. Such conditioning circuitry 18 may include, for example, an active or passive filter designed to pass signals of such duration as to be consistent with a strike of sufficient energy to cause stress on protection devices.

The pulse detector 10 may be located in a fire alarm panel 20 of the fire alarm system 12 and may be an integral component of the electrical protection circuitry 11 within the fire alarm panel 20. Alternatively, the pulse detector 10 may be an independent module located within or without the fire alarm panel 20. For example, the pulse detector 10 and the fire alarm panel 20 may be located in different rooms of the same building, or in different buildings that are remote from each other, and may be operatively interconnected by conductive wiring extending between the pulse detector 10 and the electrical protection circuitry 11 of the fire alarm panel 20. The pulse detector 10 may alternatively or additionally be electrically connected to any or all of a plurality of field wires 22 that extend between various components of the fire alarm system 12, including, but not limited to, the fire alarm panel 20, various sensors 24, and various notification devices 26 distributed throughout a building. The pulse detector 10 may further be connected to any other portion of the fire alarm system 12 that is susceptible to transient electrical energy strikes. Thus, during normal operation of the fire alarm system 12, the processor 14 receives as input a voltage signal representing the voltage in the electrical protection circuitry 11 of the fire alarm system 12. The processor 14 thereby continuously monitors the operating voltage in the protection circuitry 11.

A typical transient energy event, such as a lightning strike, generally involves the spontaneous transmission of electrical energy to earth. When such an event occurs in the vicinity of the fire alarm system 12, a quantity of the electrical energy may be channeled into the field wiring 22 of the fire alarm system 12 and transmitted through the wiring 22 to the fire alarm panel 20. This may cause the voltage in the fire alarm panel circuitry 11, which may be biased, for example, so that the earth reference is approximately 50% of the panel's supply voltage during normal operation, to fluctuate relative to the earth reference depending on the polarity of the transient pulse. These fluctuations can be detected as positive and negative energy "pulses" by earth-fault detection components of the fire alarm panel circuitry 11. The processor 14, which is operatively connected to the fire alarm panel circuitry 11 as described above, receives such pulses as input after the pulses are processed by the conditioning circuitry 18. The processor 14 may be programmed to increment a counter each time a pulse is received, wherein each pulse may be identified as representing a significant transient electrical energy strike sustained by the fire alarm system 12. For example, a significant transient electrical energy strike may be defined as any strike meeting or exceeding transient pulse levels set forth in the UL 864 electrical protection system test. Such pulse levels are outlined in the following table:

| Peak Voltage | Min Energy | Min Pulse Width |
| --- | --- | --- |
| 2400 V | 1.0 J | 80 microseconds |
| 1000 V | 0.31 J | 150 microseconds |
| 500 V | 0.10 J | 250 microseconds |
| 100 V | .011 J | 1,120 microseconds |

The processor 14 thereby generates a record of transient electrical energy strikes, wherein such record may further include the magnitude of each strike (e.g., voltage fluctuation relative to reference), the duration of each strike, as well as the time and date when each strike occurs. The processor 14 may store the generated record in the memory unit 16 of the pulse detector 10 for subsequent review as further described below.

Figure 2:
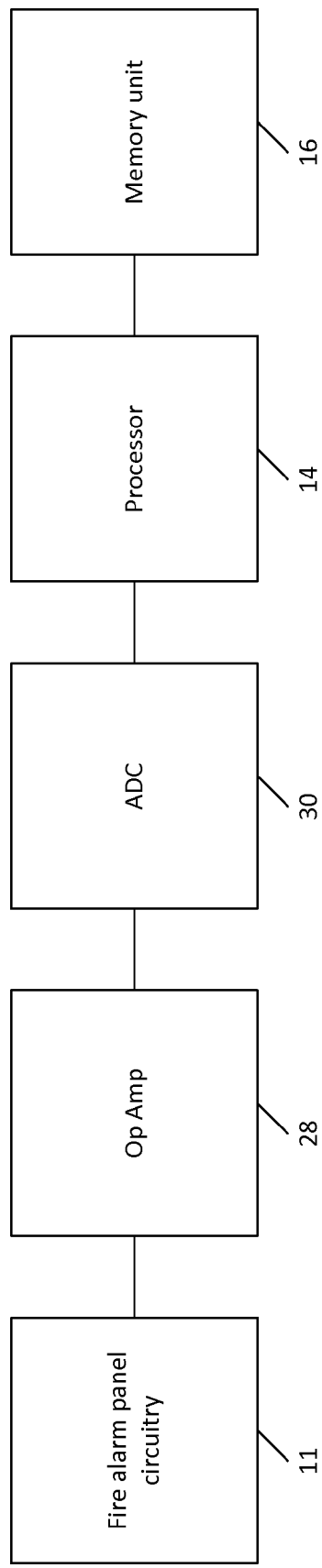
FIG. 2 is a schematic diagram illustrating an alternative embodiment of a transient electrical strike detector in accordance with the present disclosure.

An alternative embodiment of the pulse detector 10 is contemplated wherein the voltage signal generated by the fire alarm panel circuitry 11 may be received by the pulse detector 10 as a continuous voltage signal instead of discrete pulses. For example, referring to FIG. 2, the fire alarm panel voltage signal may be fed through an operational amplifier ("op amp") 28 connected to an analog-to-digital convertor ("ADC") 30. The output of the ADC 30 may then be received as input by the processor 14 of the pulse detector 10. The processor 14 may be programmed to increment a counter upon the occurrence of signal fluctuations that extend outside of a predefined normal operating voltage range, wherein such fluctuations are identified as representing significant transient electrical energy strikes sustained by the fire alarm system 12 (wherein such strikes may be defined according to the UL 864 pulse level table above, for example). Particularly, the amplitude and duration of voltage fluctuations may represent amounts of electrical energy absorbed by the electrical protection circuitry 11 of the fire alarm system during transient energy strikes. Voltage fluctuations that are not outside of the predefined voltage range may be interpreted as representing normal operating variations or insignificant transient energy events and are, therefore, not counted by the processor 14. The processor 14 may record the number, magnitude, date, and time of identified transient strikes in the memory unit 16 as described above. Additionally or alternatively, the processor 14 may store the digital voltage signal from the fire alarm panel circuitry 11 in the memory unit 16.

In addition to being stored in the memory unit 16 of the pulse detector 10, it is contemplated that the data generated by the processor 14, including the quantity, magnitude, time, date, and duration of identified transient events, may be made available for manual or automatic upload to another computing device. For example, the data can be manually or automatically uploaded to a laptop computer, tablet computer, or other mobile computing device, such as via Universal Serial Bus (USB) connection or other wired or wireless data communication means, including, but not limited to, Wi-Fi or Bluetooth connection. It is further contemplated that the data can be manually or automatically transmitted to a local (i.e. onsite) or remote (i.e. offsite) workstation via wired or wireless commination means. The data are thereby made available for convenient review by a system operator.

Referring again to FIG. 1, the fire alarm panel may include a user interface 32 that is operatively connected to the processor 14 and/or the memory unit 16. The user interface 32 may include a display 34 that may be the same display as that of the fire alarm panel 20, such as if the pulse detector 10 is integral with the fire alarm panel 20, or may be an independent display that is separate from the display of the fire alarm panel 20, such as if the pulse detector 10 is located remote from the fire alarm panel 20. During operation of the pulse detector 10, the processor 14 and/or the memory unit 16 may output data relating to detected transient energy strikes to the display 34, where such data can be reviewed by an operator. For example, the display 34 may present a record of the total number of transient energy strikes sustained by the fire protection circuitry 11 of the alarm system 12, including the magnitude, time, date, and duration of each strike, and may additionally or alternatively present a graphical or numerical representation of a recorded voltage signal from the fire alarm panel 20. Such a record may be useful for determining whether preemptive system service is necessary. For example, upon observing that the circuitry 11 of the fire alarm system 12 has sustained a large number of transient strikes, an operator may be prompted to perform a check of the protection circuitry 11 of the system. If it is determined that a protection device, such as, for example, a transient voltage suppression (TVS) diode or a metal-oxide varistor, has been damaged, such device can be repaired or replaced before degradation of the device results in a hard failure of the fire alarm system 12.

It is contemplated that the processor 14 may be programmed to output a warning message to the display 34 after a predetermined number and/or magnitude of transient energy strikes are recorded, wherein such a message may advise an operator that the fire alarm system 12, or particular components of the fire alarm system 12, are in danger of impending failure due to such strikes. For example, the display 34 may present a message stating the system has sustained 500 significant transient events, and that service should be called. Additionally, units that are connected to a remote Service Resource Center or the like via a network connection could be serviced under contract on an automatic basis, minimizing down time of the system. It is further contemplated that, in the event that a system failure does occur as a result of transient energy strikes, the processor 14 may be programmed to output a message to the display 34 informing an operator of the cause of the failure. For example, the display 34 may present a message stating "The system has sustained 500 transient energy events equal to the UL 864 transient test." Presenting such information could be useful in combating customer perception of a premature failure due to deficiencies in the quality of the fire alarm system 12 or its electrical protection circuitry 11.

The user interface 32 may further include an input device 36, such as a keypad, for example, that may be the same as or separate from an input device of the fire alarm panel 20. An operator may use the input device 36 of the user interface 32 to modify the pulse detection parameters of the processor 14. For example, an operator may use the input device 36 to set the detection sensitivity and/or the number of events that should trigger a warning message or a service call as described above. The input device 36 may facilitate many other functions, such as turning the pulse detector 10 on and off and resetting the counter of the pulse detector 10.

Figure 3:
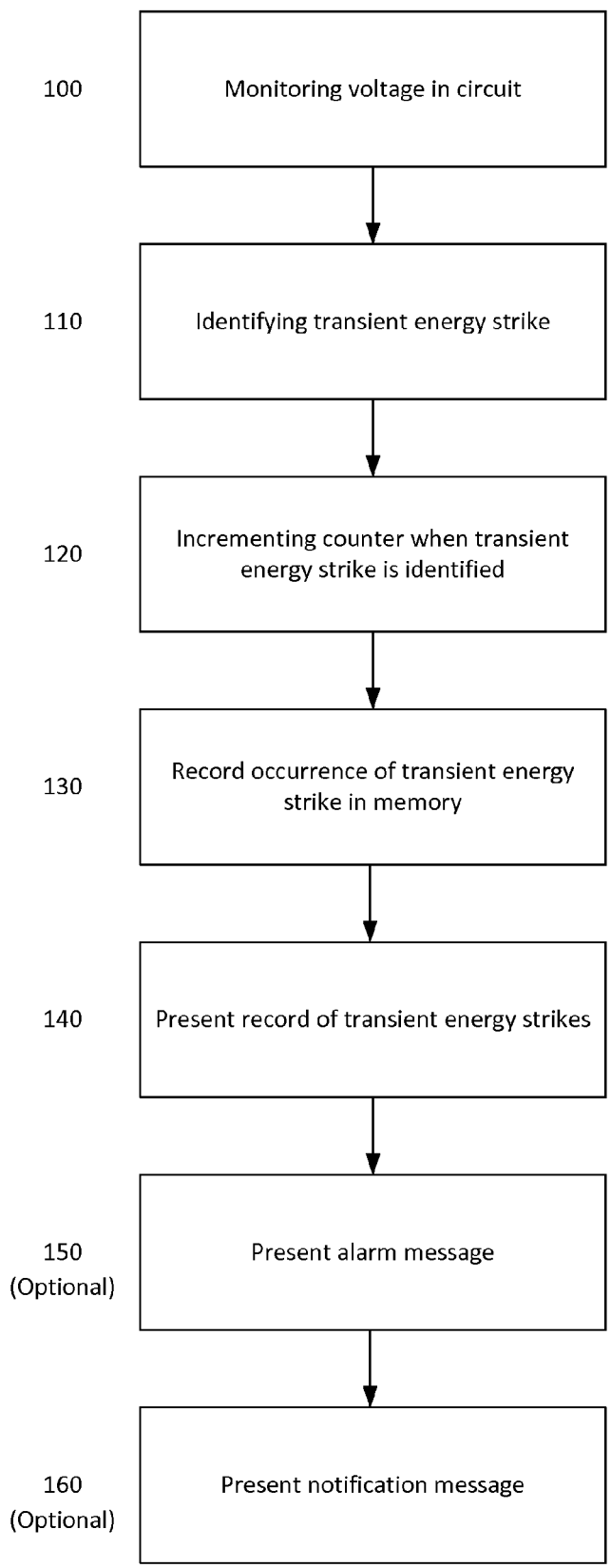
FIG. 3 is a process flow diagram illustrating a method for monitoring a circuit for the occurrence of transient electrical energy strikes in accordance with the present disclosure.

Referring to FIG. 3, a flow diagram illustrating an exemplary embodiment of a method in accordance with present disclosure is presented. At step 100 of the method, an operating voltage in the circuitry of a fire alarm system, such as in the electrical protection circuitry of a fire alarm panel of the system, is monitored by a processor. Upon the occurrence of a transient electrical energy strike to the fire alarm system, a quantity of electrical energy from the strike may be transmitted to the circuitry of the fire alarm panel. The transient strike thereby results in a voltage fluctuation in the fire alarm panel circuitry and, at step 110, such a fluctuation may be identified as a significant transient electrical energy strike sustained by the system. Identifying a voltage fluctuation as a transient pulse may include a determination by the processor of whether the monitored voltage fluctuates outside of a predetermined, normal operating voltage range. If a voltage fluctuation is identified as a transient strike, the processor may increment a counter at step 120.

At step 130, the processor may record the occurrence of each identified transient strike in a memory unit, including the magnitude of each strike as well as the time and date when each strike occurred. Such processor may further record the duration of each transient strike. Still further, the processor may record a voltage signal representing the voltage in the fire alarm panel circuitry over a period of time. At step 140, the processor may present some or all of the recorded data on a display for review by an operator.

At optional step 150, the processor may present an alarm message on the display after a predetermined number and/or magnitude of transient strikes are recorded, wherein such message may warn of the potential for an impending system or component failure. At optional step 160, the processor may present a notification message on the display after a system or component failure occurs, wherein such message indicates that the system or component failure was caused by a particular number of transient strikes sustained by the fire alarm system.

As used herein, an element or step recited in the singular and proceeded with the word "a" or "an" should be understood as not excluding plural elements or steps, unless such exclusion is explicitly recited. Furthermore, references to "one embodiment" of the present invention are not intended to be interpreted as excluding the existence of additional embodiments that also incorporate the recited features.

While certain embodiments of the disclosure have been described herein, it is not intended that the disclosure be limited thereto, as it is intended that the disclosure be as broad in scope as the art will allow and that the specification be read likewise. Therefore, the above description should not be construed as limiting, but merely as exemplifications of particular embodiments. Those skilled in the art will envision other modifications within the scope and spirit of the claims appended hereto.

The various embodiments or components described above, for example, the pulse detector and the components or processors therein, may be implemented as part of one or more computer systems, which may be separate from or integrated with the circuit. The computer system may include a computer, an input device, a display unit and an interface, for example, for accessing the Internet. The computer may include a microprocessor. The microprocessor may be connected to a communication bus. The computer may also include memories. The memories may include Random Access Memory (RAM) and Read Only Memory (ROM). The computer system further may include a storage device, which may be a hard disk drive or a removable storage drive such as a floppy disk drive, optical disk drive, and the like. The storage device may also be other similar means for loading computer programs or other instructions into the computer system.

As used herein, the term "computer" may include any processor-based or microprocessor-based system including systems using microcontrollers, reduced instruction set circuits (RISCs), application specific integrated circuits (ASICs), logic circuits, and any other circuit or processor capable of executing the functions described herein. The above examples are exemplary only, and are thus not intended to limit in any way the definition and/or meaning of the term "computer."

The computer system executes a set of instructions that are stored in one or more storage elements, in order to process input data. The storage elements may also store data or other information as desired or needed. The storage element may be in the form of an information source or a physical memory element within the processing machine.

The set of instructions may include various commands that instruct the computer as a processing machine to perform specific operations such as the methods and processes of the various embodiments of the invention, for example, for generating two antenna patterns having different widths. The set of instructions may be in the form of a software program. The software may be in various forms such as system software or application software. Further, the software may be in the form of a collection of separate programs, a program module within a larger program or a portion of a program module. The software also may include modular programming in the form of object-oriented programming. The processing of input data by the processing machine may be in response to user commands, or in response to results of previous processing, or in response to a request made by another processing machine.

As used herein, the terms "software" and "firmware" are interchangeable, and include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program.

What is claimed is:

1. A device for monitoring transient electrical energy strikes sustained by a circuit, the device comprising:
    a processor operatively coupled to the circuit, the processor configured to increment a counter when the circuit is subjected to a transient electrical energy strike; and
    a memory operatively connected to the processor, the memory configured to store transient electrical energy strike data from the processor;
    wherein the data stored in the memory includes a time and date of each identified transient electrical energy strike.

2. The device of claim 1, wherein the processor is configured to identify the occurrence of a transient electrical energy strike when a voltage fluctuation in the circuit is outside of a predetermined operating voltage range.

3. The device of claim 1, wherein the data stored in the memory includes a magnitude of each identified transient electrical energy strike.

4. The device of claim 1, wherein the data stored in the memory includes a duration of each identified transient electrical energy strike.

5. The device of claim 1, wherein the data stored in the memory includes a voltage signal representing a voltage in the circuit over a period of time.

6. The device of claim 1, further comprising a display operatively connected to the processor and configured to present data generated by the processor.

7. The device of claim 1, further comprising a display operatively connected to the memory and configured to present data stored in the memory.

8. The device of claim 1, further comprising an input device operatively connected to the processor for facilitating modification of operating parameters of the processor.

9. The device of claim 1, wherein the processor is configured to generate an alarm message after a predetermined number of transient electrical energy strikes are identified by the processor, wherein the alarm message indicates a possibility of impending failure.

10. The device of claim 1, wherein the processor is configured to generate a notification message after a failure, wherein the notification message indicates that the failure may have been caused by a number of transient electrical energy strikes.

11. The device of claim 1, wherein the circuit forms part of a fire detection system.

12. A method for monitoring transient electrical energy strikes sustained by a circuit, the method comprising:
    monitoring a voltage in the circuit; identifying a voltage fluctuation in the circuit as a transient electrical energy strike;
    incrementing a counter when a transient electrical energy strike is detected; and
    storing a record of transient electrical energy strikes that are identified, including
    storing a time and date of each transient electrical energy strike that is identified.

13. The method of claim 12, wherein the step of identifying a voltage fluctuation in the circuit as a transient electrical energy strike comprises determining whether the voltage in the circuit fluctuates outside of a predetermined operating voltage range.

14. The method of claim 12, wherein the step of storing a record of transient electrical energy strikes comprises storing a magnitude of each transient electrical energy strike that is identified.

15. The method of claim 12, wherein the step of storing a record of transient electrical energy strikes comprises storing a duration of each transient electrical energy strike that is identified.

16. The method of claim 12, wherein the step of storing a record of transient electrical energy strikes comprises storing a voltage signal representing a voltage in the circuit over a period of time.

17. The method of claim 12, further comprising displaying at least a portion of the stored record.

18. The method of claim 12, further comprising generating an alarm message after a predetermined number of transient electrical energy strikes are identified, wherein the alarm message indicates a possibility of impending failure.

19. The device of claim 12, further comprising generating a notification message after a failure, wherein the notification message indicates that the failure may have been caused by a number of transient electrical energy strikes.

* * * * *